(12) United States Patent
Fan (10) Patent No.: US 10,476,443 B2
(45) Date of Patent: Nov. 12, 2019

(54) DYNAMIC AMPLIFICATION CIRCUIT

(71) Applicant: SHENZHEN GOODIX TECHNOLOGY CO., LTD., Shenzhen (CN)

(72) Inventor: Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/110,127

(22) Filed: Aug. 23, 2018

(65) Prior Publication Data
US 2019/0036491 A1   Jan. 31, 2019

Related U.S. Application Data

(63) Continuation of application No. PCT/CN2017/094529, filed on Jul. 26, 2017.

(51) Int. Cl.
*H03F 3/45* (2006.01)
*H03F 1/30* (2006.01)
(Continued)

(52) U.S. Cl.
CPC ........... *H03F 1/301* (2013.01); *H03F 1/0205* (2013.01); *H03F 3/45179* (2013.01);
(Continued)

(58) Field of Classification Search
CPC ........ H03F 1/301; H03F 3/45183; H03F 3/72; H03F 1/0205; H03F 3/45179;
(Continued)

(56) References Cited

U.S. PATENT DOCUMENTS 8,829,993 B2   9/2014 Briffa et al.
9,160,287 B2   10/2015 Briffa et al.
(Continued)

FOREIGN PATENT DOCUMENTS

CN   1741375 A   3/2006
CN   101471636 A   7/2009

OTHER PUBLICATIONS

Huang Hai et al.: "28.4 A 12b 330MS/s pipelined-SAR ADC with PVT-stabilized dynamic amplifier achieving <1dB SNDR variation", 2017 IEEE International Solid-State Circuits Conference (ISSCC) , IEEE, Feb. 5, 2017 (Feb. 5, 2017), pp. 472-473, XP033073631, DOI: 10.1109/1SSCC.2017.7870466 [retrieved on Mar. 2, 2017].

(Continued)

*Primary Examiner* — Khanh V Nguyen (57) ABSTRACT

The present disclosure discloses a dynamic amplification circuit, including: a first drive circuit, receives a first control signal to generate a first and a second voltage signal; a second drive circuit, receives the first and the second voltage signal to generate a first drive signal; a third drive circuit, receives the first control signal and the first drive signal to generate a second control signal; and a dynamic amplifier DA, controls a first and a second control switch according to the control signals; in a first time period, the first control signal is high level, the second control signal is low level; in a second time period, the opposite is the case; in a third time period, the first and the second control signal are both at low level, a duration of the second time period is inversely proportional to a transconductance of a transistor in a saturation region.

13 Claims, 5 Drawing Sheets

(51) Int. Cl.
*H03F 1/02* (2006.01)
*H03F 3/72* (2006.01)
*H03K 19/20* (2006.01)

(52) U.S. Cl.
CPC ........... *H03F 3/45183* (2013.01); *H03F 3/72* (2013.01); *H03F 2200/297* (2013.01); *H03F 2200/312* (2013.01); *H03F 2200/447* (2013.01); *H03F 2203/45134* (2013.01); *H03F 2203/45631* (2013.01); *H03F 2203/45726* (2013.01); *H03K 19/20* (2013.01)

(58) Field of Classification Search
CPC . H03F 2203/45726; H03F 2203/45631; H03F 2203/45134; H03F 2200/312; H03F 2200/297; H03F 2200/447; H03K 19/20
See application file for complete search history.

(56) References Cited

U.S. PATENT DOCUMENTS

| | | | |
|---|---|---|---|
| 9,172,336 | B2 | 10/2015 | Briffa et al. |
| 9,819,314 | B1 | 11/2017 | Chiu et al. |
| 2014/0118065 | A1 | 5/2014 | Briffa et al. |
| 2014/0118072 | A1 | 5/2014 | Briffa et al. |
| 2014/0132354 | A1 | 5/2014 | Briffa et al. |

OTHER PUBLICATIONS

Hai Huang: "High-Speed and Low-Power Pipelined SAR ADCS With Passive Residue Transfer and Dynamic Amplifier", May 31, 2017 (May 31, 2017), pp. 1-75, XP055568666, Retrieved from the Internet: URL: http://libtreasures.utdallas.edu/xmlui/bitstream/handle/10735.1/5793/ETD-5608-013-HUANG-7873.84.pdf?sequence=6 [retrieved on Mar. 13, 2019].

DYNAMIC AMPLIFICATION CIRCUIT

CROSS REFERENCE TO RELATED APPLICATIONS

The present application is a continuation of international application No. PCT/CN2017/094529, filed on Jul. 26, 2017, which is hereby incorporated by reference in its entirety.

TECHNICAL FIELD

Embodiments of the present application relate to the field of circuits, and in particular, to a dynamic amplification circuit.

BACKGROUND

A dynamic amplifier (DA) has advantages of low power consumption and no overshoot in comparison with a conventional operational amplifier with feedback circuit.

However, gain of the dynamic amplifier will vary with, for example, a semiconductor process, a supply voltage and a temperature (Process, Voltage, Temperature, PVT), which limits its application to some extent.

Therefore, a dynamic amplification circuit is required, which is capable of providing relatively stable gain.

SUMMARY

The present application provides a dynamic amplification circuit, which is capable of providing relatively stable gain.

According to a first aspect, a dynamic amplification circuit is provided, including:

a first drive circuit, configured to receive a first control signal, and generate a first voltage signal and a second voltage signal, the first voltage signal varying with time, and the second voltage signal is a constant voltage;

a second drive circuit, configured to receive the first voltage signal and the second voltage signal, and generate a first drive signal;

a third drive circuit, configured to receive the first control signal and the first drive signal, and generate a second control signal; and a dynamic amplifier DA, including a first control switch, a second control switch and a transistor, where the DA is configured to receive the first control signal and the second control signal, and control turnon and turnoff of the first control switch and the second control switch respectively through the first control signal and the second control signal;

in a first time period, the first control signal is at high level, a voltage value of the first voltage signal is a first voltage value, a voltage value of the second voltage signal is a second voltage value, and the second control signal is at low level;

in a second time period after the first time period, the first control signal is at low level, the voltage value of the first voltage signal increases and is less than the second voltage value, the first drive signal is at low level, and the second control signal is at high level; and in a third time period after the second time period, the first control signal is at low level, the voltage value of the first voltage signal is greater than or equal to the second voltage value, the first drive signal is at high level, and the second control signal is at low level, where duration of the second time period is inversely proportional to a transconductance of the transistor in the DA in a saturation region.

Therefore, a dynamic amplification circuit of an embodiment of the present application controls voltage values output by a first voltage signal and a second voltage signal through a first control signal, and then controls duration of a second time period to be inversely proportional to a transconductance of a transistor in a DA in a saturation region according to the first voltage signal and the second voltage signal, so that the dynamic amplification circuit is still capable of providing relatively stable gain when PVT change.

With reference to the first aspect, in a possible implementation manner of the first aspect, the first drive circuit includes:

a first bias circuit, configured to receive the first control signal, and generate the first voltage signal, where the first bias circuit includes a first transistor, a first current source and a first capacitor, a drain of the first transistor is connected to the first current source, one end of the first capacitor is connected to the drain of the first transistor and is connected to a gate of the first transistor via a first switch device, a source of the first transistor is connected to the other end of the first capacitor, and the drain of the first transistor is used to output the first voltage signal; and a second bias circuit, configured to output the second voltage signal, where the second bias circuit includes a second transistor and a second current source, a drain of the second transistor is connected to the second current source, the drain of the second transistor is connected to a gate of the second transistor, and the drain of the second transistor is used to output the second voltage signal, where a transistor parameter of the first transistor is the same as the corresponding parameter of the second transistor, and a current value of the second current source is greater than a current value of the first current source.

With reference to the first aspect, in a possible implementation manner of the first aspect, the first control signal is further used to control turnon and turnoff of the first switch device, where the first control signal is particularly used to:

control, in the first time period, the first switch device to be turned on, and control, in the second time period and the third time period, the first switch device to be turned off.

With reference to the first aspect, in a possible implementation manner of the first aspect, transistor parameters of the first transistor and the second transistor are the same as that of the transistor of the DA.

With reference to the first aspect, in a possible implementation manner of the first aspect, the first transistor and the second transistor are metal oxide semiconductor MOS transistors.

With reference to the first aspect, in a possible implementation manner of the first aspect, a current provided for the first transistor and a current provided for the transistor of the DA are produced by a mirror current source.

With reference to the first aspect, in a possible implementation manner of the first aspect, the second drive circuit includes a second capacitor, a first inverter and a second inverter, where one end of the second capacitor receives the first voltage signal via a second switch device and receives the second voltage signal via a third switch device, and the other end of the second capacitor is connected to an input end of the first inverter; and the input end and an output end of the first inverter are connected via a fourth switch device, the output end of the first inverter is connected to an input end of the second inverter, and an output end of the second inverter is used to output the first drive signal.

With reference to the first aspect, in a possible implementation manner of the first aspect, the first control signal is further used to:

control turnon and turnoff of the second switch device, the third switch device and the fourth switch device, where the first control signal is particularly used to:

control, in the first time period, the second switch device to be turned off and the third switch device and the fourth switch device to be turned on, and control, in the second time period and the third time period, the second switch device to be turned on and the third switch device and the fourth switch device to be turned off With reference to the first aspect, in a possible implementation manner of the first aspect, the second drive circuit is a continuous time comparator, a first input end of the continuous time comparator is used to receive the first voltage signal, a second input end of the continuous time comparator is used to receive the second voltage signal, and an output end of the continuous time comparator is used to output the first drive signal.

With reference to the first aspect, in a possible implementation manner of the first aspect, the third drive circuit includes a third inverter, a fourth inverter and an AND circuit, where an input end of the third inverter is used to receive the first control signal, and an output end of the third inverter is connected to a first input end of the AND circuit;

an input end of the fourth inverter is used to receive the first drive signal, and an output end of the fourth inverter is connected to a second input end of the AND circuit; and an output end of the AND circuit is used to output the second control signal.

With reference to the first aspect, in a possible implementation manner of the first aspect, the DA further includes a third capacitor, one end of the third capacitor is connected to a cathode of a power supply, the other end of the third capacitor is connected to an anode of the power supply via the first control switch, the other end of the third capacitor is further connected to one end of the second control switch, and the other end of the second control switch is connected to a drain of the transistor;

the first control signal is particularly used to:

control, in the first time period, the first control switch to be turned on, and control, in the second time period and the third time period, the first control switch to be turned off; and the second control signal is particularly used to:

control, in the first time period, the second control switch to be turned off, control, in the second time period, the second control switch to be turned on, and control, in the third time period, the second control switch to be turned off With reference to the first aspect, in a possible implementation manner of the first aspect, a voltage value obtained by subtracting a threshold voltage of the second transistor from the second voltage value is a multiple of a voltage value obtained by subtracting a threshold voltage of the first transistor from the first voltage value.

Therefore, a dynamic amplification circuit of the embodiments of the present application controls voltage values output by a first voltage signal and a second voltage signal through a first control signal, and then controls duration of a second time period to be inversely proportional to a transconductance of a transistor in a DA in a saturation region according to the first voltage signal and the second voltage signal, so that the dynamic amplification circuit is still capable of providing relatively stable gain when PVT change.

DESCRIPTION OF EMBODIMENTS

A technical solution of the present application is hereinafter described in combination with the accompanying drawings.

Figure 1:
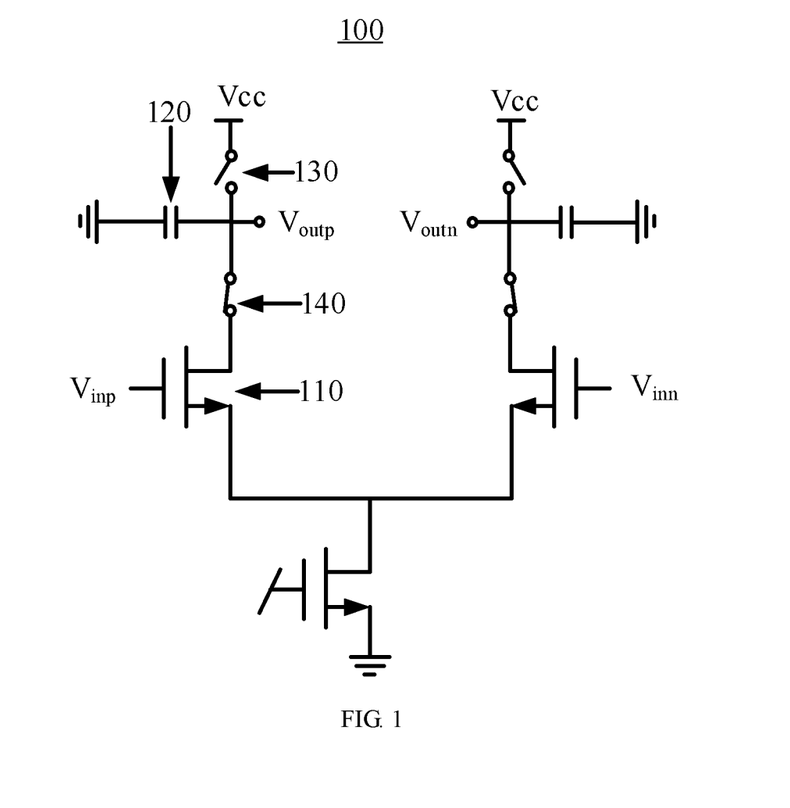
FIG. 1 is a schematic structural diagram of an existing dynamic amplification circuit.

FIG. 1 is a schematic structural diagram of an existing dynamic amplifier. As shown in FIG. 1, a dynamic amplifier 100 has a symmetrical structure, devices included in a right half of the structure are the same as devices included in a left half of the structure, and parameters of the devices in the right half of the structure are the same as parameters of the devices in the left half of the structure. Here, the left half of the structure is taken as an example for description, operating states of the devices in the right half of the structure are the same as that of the corresponding devices in the left half of the structure, and it will not be repeated redundantly herein.

The dynamic amplifier 100 includes a transistor 110, a capacitor 120, a first control switch 130 and a second control switch 140.

Operating states of the dynamic amplifier 100 includes following two phases:

in a first phase, the first control switch 130 is turned on, the second control switch 140 is turned off, the capacitor 120 is connected to an anode of a power supply ($V_{cc}$), and the capacitor is in a charging state; and in a second phase, the first control switch 130 is turned off, the second control switch 140 is turned on, the capacitor 120 is connected to a drain of the transistor 110 via the second control switch 140, and the capacitor is in a discharging state.

Figure 2:
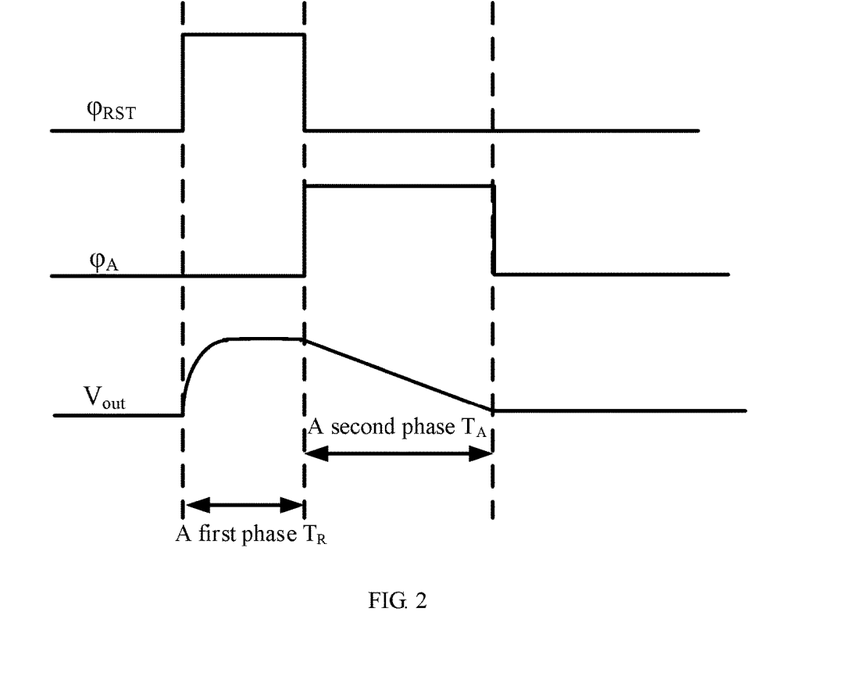
FIG. 2 is a logic timing diagram of an existing dynamic amplification circuit.

FIG. 2 is a logic timing diagram of the dynamic amplifier 100, where $\varphi_{RST}$ is a timing of the first control switch 130, $\varphi_A$ is a timing of the second control switch 140, and $V_{out}$ is a timing of an output voltage.

As shown in FIG. 2, in a first phase (denoted as $T_R$), the first control switch 130 is turned on, the second control switch 140 is turned off, and the dynamic amplifier is in a reset state; and in a second phase (denoted as $T_A$), the first control switch 130 is turned off, the second control switch 140 is turned on, the dynamic amplifier is in an amplifying state, and duration of the dynamic amplifier in the amplifying state is duration $T_A$ of the second phase.

Figure 3:
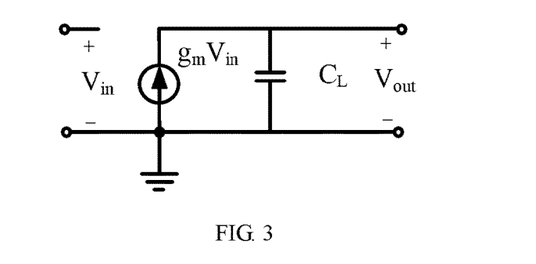
FIG. 3 is an equivalent circuit diagram of an existing dynamic amplification circuit.

FIG. 3 is an equivalent circuit diagram of the dynamic amplifier shown in FIG. 1, where $g_m$ is a transconductance of the transistor 110, $C_L$ is a capacitance value of the capacitor 120, and it can be obtained from FIG. 3 that an amplification coefficient (gain) $A_v$ of the dynamic amplification circuit is shown as a formula (1):

$$A_v = \frac{V_{out}}{V_{in}} = \frac{g_m * V_{in} * T_A/C_L}{V_{in}} = g_m * T_A/C_L. \qquad \text{Formula (1)}$$

Since $g_m$ and $C_L$ may vary with PVT, it results in that the gain of the dynamic amplifier is unstable. $T_A$ may be controlled by a designer. Therefore, an embodiment of the present application provides a dynamic amplification circuit, which is capable of providing relatively stable gain by controlling duration $T_A$ of a second phase.

Figure 4:
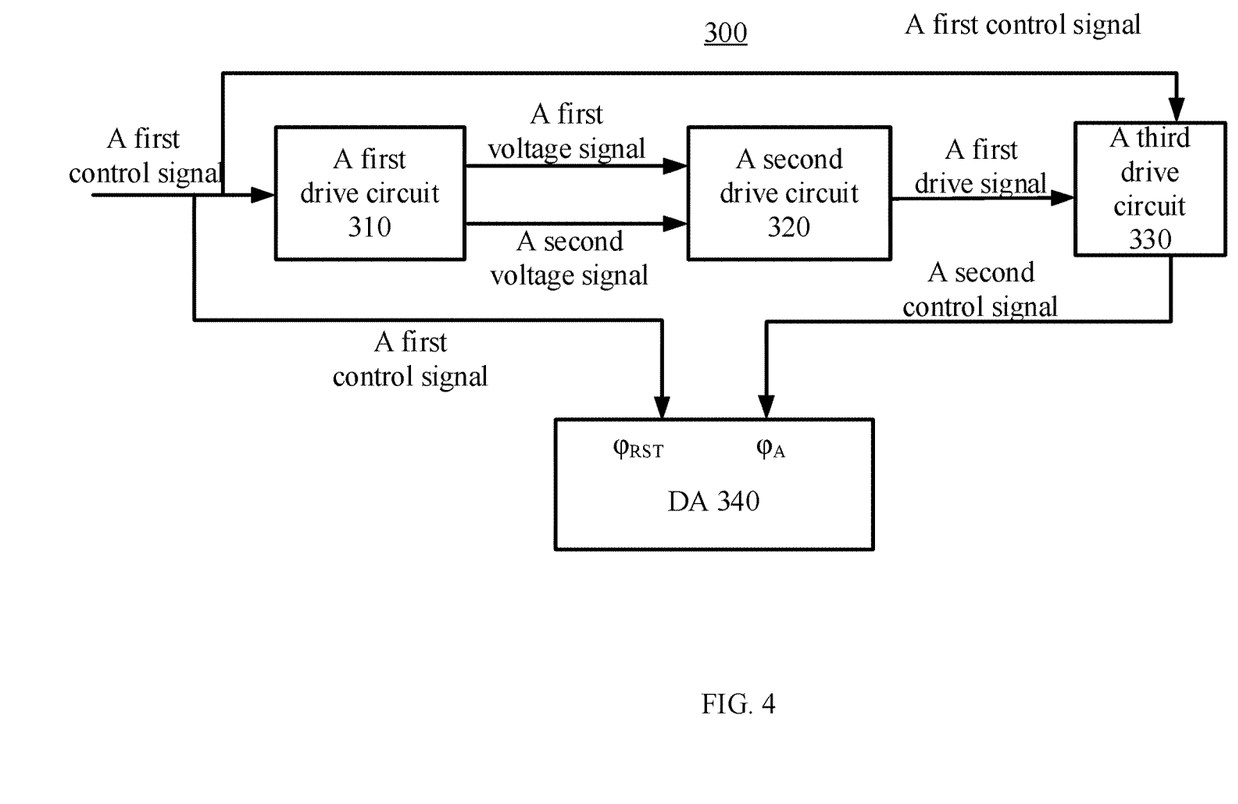
FIG. 4 is a schematic diagram of a dynamic amplification circuit according to an embodiment of the present disclosure.

FIG. 4 is a schematic structural diagram of a dynamic amplification circuit 300 provided by an embodiment of the present application. As shown in FIG. 4, the dynamic amplification circuit 300 includes:

a first drive circuit 310, configured to receive a first control signal, and generate a first voltage signal and a second voltage signal, the first voltage signal varying with time, and the second voltage signal is a constant voltage;

a second drive circuit 320, configured to receive the first voltage signal and the second voltage signal, and generate a first drive signal;

a third drive circuit 330, configured to receive the first control signal and the first drive signal, and generate a second control signal; and a dynamic amplifier DA 340, including a first control switch, a second control switch and a transistor, where the DA is configured to receive the first control signal and the second control signal, and control turnon and turnoff of the first control switch and the second control switch respectively through the first control signal and the second control signal;

namely, the first control signal and the second control signal respectively correspond to control signals $\varphi_{RST}$ and $\varphi_A$ in FIG. 2, that is, the first control signal and the second control signal may serve as the control signals $\varphi_{RST}$ and $\varphi_A$ in FIG. 2, and be respectively used to control the first control switch 130 and the second control switch 140 of the DA 100.

Optionally, the DA 340 may be the DA 100 shown in FIG. 1, or may also be another equivalent circuit. The DA 340 may further include a third capacitor, and the third capacitor may correspond to the capacitor 120 in the DA 100 shown in FIG. 1, where one end of the third capacitor is connected to a cathode of a power supply, the other end of the third capacitor is connected to an anode of the power supply via the first control switch, the other end of the third capacitor is further connected to one end of the second control switch, and the other end of the second control switch is connected to a drain of the transistor.

In an embodiment of the present application, the first control signal is particularly used to:

control, in a first time period, the first control switch to be turned on, and control, in a second time period and a third time period, the first control switch to be turned off; and the second control signal is particularly used to:

control, in the first time period, the second control switch to be turned off, control, in the second time period, the second control switch to be turned on, and control, in the third time period, the second control switch to be turned off.

A logic timing diagram of a dynamic amplification circuit according to an embodiment of the present disclosure is described in detail below in combination with FIG. 5.

In a first time period (corresponding to the foregoing first phase), i.e., a time period between $t_1$ and $t_2$, a first control signal is at high level, a first voltage signal $V_1$ output by a first drive circuit is a first voltage value, a second voltage signal $V_2$ output by the first drive circuit is a second voltage value, and the first voltage value is less than the second voltage value. A second control signal output by a third drive circuit is at low level.

Figure 5:
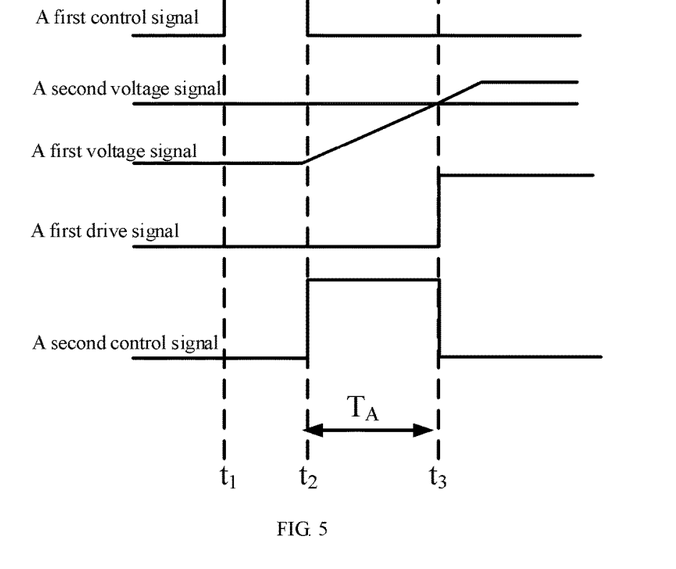
FIG. 5 is a logic timing diagram of a dynamic amplification circuit according to an embodiment of the present disclosure.

It should be noted that, in the embodiment of the present application, in the first time period, a first drive signal may output low level, or may also output high level, and it is only used as an example in FIG. 5 that the first drive signal is at low level, as long as the first control signal is at high level and the second control signal is at low level in the first time period.

In a second time period (corresponding to the foregoing second phase) after the first time period, i.e., a time period between $t_2$ and $t_3$, the first control signal is at low level; in the second time period, the first voltage signal output by the first drive circuit increases and is still less than the second voltage value, the second voltage signal output by the first drive circuit is still the second voltage value, the first drive signal output by a second drive circuit according to the first voltage signal and the second voltage signal is still at the low level, and level of the second control signal output by the third drive circuit according to the first control signal and the first drive signal transitions from the low level to high level.

In a third time period after the second time period, i.e., a time period after $t_3$, the first control signal is at low level, the first voltage signal output by the first drive circuit is greater than or equal to the second voltage value, level of the first drive signal output by the second drive circuit transitions from the low level to high level, and the level of the second control signal output by the third drive circuit transitions from the high level to low level.

Namely, the first drive circuit of the embodiment of the present application may output the first voltage signal $V_1$ and the second voltage signal $V_2$ according to the first control signal, where in the first time period, $V_1<V_2$, in the second time period, $V_1$ increases and is still less than $V_2$, and in the third time period, $V_1$ increases to a value greater than or equal to $V_2$, that is, a boundary line between the second time period and the third time period is a time at which $V_1$ is equal to $V_2$.

Optionally, in the third time period, $V_1$ may no longer increase after increasing to a value equal to $V_2$, or may continue to increase to a certain voltage value after being equal to $V_2$ and then no longer increase, or the like. The embodiment of the present application does not limit a voltage value of the first voltage signal in the third time period as long as the first drive signal is inverted at a time when $V_1$ is equal to $V_2$.

Further, the second drive circuit is capable of outputting the first drive signal according to the first voltage signal and the second voltage signal that vary with time, that is, the second drive circuit outputs low level when the voltage value of the first voltage signal is less than a voltage value of the second voltage signal, and outputs high level when the voltage value of the first voltage signal is greater than or equal to the voltage value of the second voltage signal.

For example, the second drive circuit may be implemented with a comparator, and in particular, the comparator may be a continuous time comparator.

Further, the third drive circuit outputs the second control signal according to the first control signal and the first drive signal, where the third drive circuit only needs to control the second control signal to output high level when the first control signal and the first drive signal are at low level, and control the second control signal to output low level when the first control signal and the first drive signal are in other states.

For example, the third drive circuit may be implemented with a combination circuit of an inverter and an AND gate. For example, the first control signal and the first drive signal are inverted, and then input to two input ends of the AND gate. At this time, the third drive circuit may control an output end of the AND gate to output high level when the first control signal and the first drive signal are at low level, and control the output end of the AND gate to output low level when the first control signal and the first drive signal are in other states.

A dynamic amplification circuit of the embodiment of the present application is capable of controlling duration $T_A$ of a second time period to be inversely proportional to a transconductance of a transistor in a DA in a saturation region through a first voltage signal and a second voltage signal, that is, $T_A = K/g_m$, so that the formula (1) may be simplified as a formula (2):

$$A_v = \frac{g_m * K/g_m}{C_L} K/C_L. \quad \text{Formula (2)}$$

In this way, gain of the dynamic amplification circuit is only related to a capacitance value; therefore, the gain of the dynamic amplification circuit is relatively stable when PVT change.

Therefore, a dynamic amplification circuit of an embodiment of the present application controls voltage values output by a first voltage signal and a second voltage signal through a first control signal, and then controls duration $T_A$ of a second time period to be inversely proportional to a transconductance of a transistor in a DA in a saturation region according to the first voltage signal and the second voltage signal, so that the dynamic amplification circuit is still capable of providing relatively stable gain when PVT change.

Implementation manners of a dynamic amplification circuit of embodiments of the present application are introduced in detail below in combination with specific examples shown in FIGS. 6 to 9.

It should be understood that examples shown in FIGS. 6 to 9 is for helping those skilled in the art better understand the embodiments of the present application, rather than for limiting the scope of the embodiments of the present application. Those skilled in the art may obviously perform, according to the provided FIGS. 6 to 9, various equivalent amendment or variations, which also fall in the scope of the embodiments of the present application.

Figure 6:
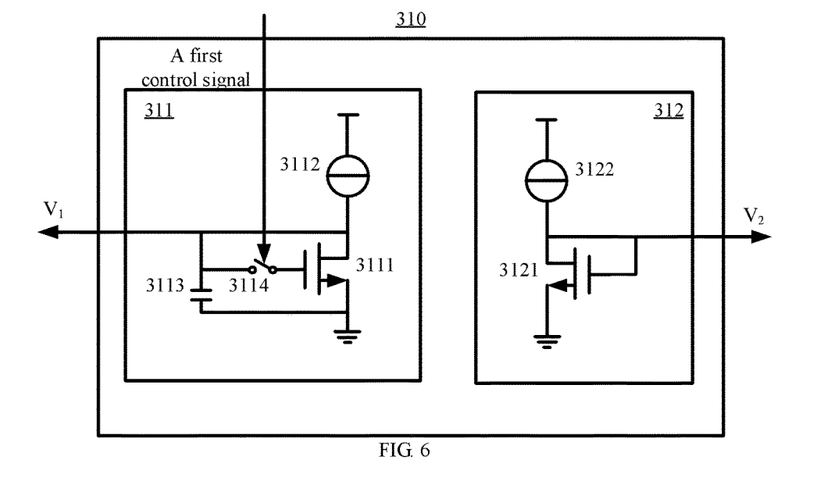
FIG. 6 is a schematic structural diagram of an example of a first drive circuit according to an embodiment of the present disclosure.

Before an introduction of a first drive circuit shown in FIG. 6, characteristics of a voltage and a current of a transistor when the transistor operates in a saturation region are firstly introduced.

A relationship between the voltage and the current of the transistor operating in the saturation region is provided as follows:

$$I_D = \frac{1}{2}\mu C_{OX}\frac{W}{L}(V_{GS} - V_{TH})^2 = \frac{1}{2}\mu C_{OX}\frac{W}{L}V_{OV}^2, \quad \text{Formula (3)}$$

where $I_D$ is a drain current of the transistor, $\mu$ is carrier mobility, $C_{ox}$ is a gate oxide capacitance value per unit area, W is a width of a gate, L is a length of the gate, $V_{GS}$ is a voltage difference between a voltage of the gate and a voltage of a source, $V_{TH}$ is a threshold voltage of the transistor or a conduction voltage between the gate and the source, and $V_{ov}$ is an overdriving voltage of the transistor.

Further, a calculation formula of a transconductance $g_m$ of the transistor may be derived from the formula (3), as shown in a formula (4):

$$g_m = \frac{dI_D}{dV_{GS}} = \mu C_{OX}\frac{W}{L}(V_{GS} - V_{TH}) = \quad \text{Formula (4)}$$
$$\mu C_{OX}\frac{W}{L}V_{OV} = \sqrt{2I_D\mu C_{OX}\frac{W}{L}} = \frac{2I_D}{V_{OV}}.$$

It can be seen from the formula (3) that, the drain current $I_D$ is proportional to $(V_{ov})^2$, or voltage drops of the gate and the source of the transistor are related only to a current flowing through the transistor after a parameter of the transistor is determined. It can be seen from the formula (4) that, $g_m$ is proportional to $2I_D/V_{ov}$, or the transconductance $g_m$ of the transistor is related only to the current flowing through the transistor after the parameter of the transistor is determined.

It should be noted that, the foregoing relationships of $I_D$ being proportional to $(V_{ov})^2$ and $g_m$ being proportional to $2I_D/V_{ov}$ are approximate proportional relationships. Due to influence of factors such as process of the transistor or environment, slight deviations may occur, and the relationships can be considered to be approximate proportional relationships since the deviation is small and within an acceptable range.

FIG. 6 is a schematic structural diagram of an example of a first drive circuit according to an embodiment of the present application. FIG. 6 shows a possible implementation manner or a preferred implementation manner of the first drive circuit; however, the embodiment of the present application is not limited to this implementation manner, and various equivalent amendment or variations according to this implementation manner fall in the scope of the embodiment of the present application.

As shown in FIG. 6, a first drive circuit 310 includes a first bias circuit 311 and a second bias circuit 312.

Particularly, the first bias circuit 311 includes a first transistor 3111, a first current source 3112, a first capacitor 3113 and a first switch device 3114. A drain (D electrode) of the first transistor 3111 is connected to the first current source 3112, one end of the first capacitor 3113 is connected to the drain (D electrode) of the first transistor 3111 and a gate (S electrode) of the first transistor 3111 via the first switch device 3114, a source (S electrode) of the first transistor 3111 is connected to the other end of the first capacitor 3113, and the drain (D electrode) of the first transistor 3111 is used to output a first voltage signal.

The second bias circuit 312 includes a second transistor 3121 and a second current source 3122, where a drain (D electrode) of the second transistor 3121 is connected to the second current source 3122, the drain (D electrode) of the second transistor 3121 is connected to a gate (S electrode) of the second transistor 3121, that is, the drain and the gate of the second transistor are short-circuited, and the drain (D electrode) of the transistor 3121 is used to output a second voltage signal.

Optionally, in the embodiment of the present application, a current value of the second current source may be a multiple of a current value of the first current source, for example, $I_2=4I_1$, or $I_2=9I_1$, or $I_2=6I_1$, where $I_1$ is the current value of the first current source, and $I_2$ is the current value of the second current source.

Optionally, in the embodiment of the present application, the first current source and the second current source may be implemented by a mirror current source, and in this way, it may be ensured that the current value of the second current source and the current value of the first current source are multiples of one another.

Since the drain and the gate of the second transistor 3121 are connected, and the second transistor 3121 operates in a saturation region, the second voltage signal output by the drain of the second transistor 3121 is approximately a constant voltage, denoted as $V_2$.

In the first bias circuit 311, the first switch device 3114 is controlled by a first control signal, that is, the first control signal may be used to control turnon and turnoff the first switch device 3114. Particularly, in a first time period, the first control signal is used to control the first switch device 3114 to be turned on, and in a second time period and a third time period, the first control signal is used to control the first switch device 3114 to be turned off Operating states of the first drive circuit are described in detail below in combination with FIG. 5.

In $t_1$, the first switch device 3114 is turned on, the drain and the gate of the first transistor 3111 are short-circuited, that is, $V_{GS}=V_{DS}$, the first transistor 3111 operates in the saturation region, and a drain current of the first transistor 3111 is approximately the current value of the first current source; therefore, in the first time period, the first voltage signal is approximately a constant voltage. For convenience of distinction and description, a voltage value of the first voltage signal in the first time period (i.e., a first voltage value) is denoted as $V_{T1}=V_{GS1}=V_{DS1}$, where $V_{GS1}$ is a voltage difference between a voltage of the gate and a voltage of the source of the first transistor 3111, and $V_{DS1}$ is a voltage difference between a voltage of the drain and the voltage of the source of the first transistor 3111.

At $t_2$, the first switch device 3114 is turned off, the first current source 3112 charges the first capacitor 3113, and $V_1$ increases; and at $t_3$ after $t_2$, $V_1=V_2$, and level of a first drive signal output by a second drive circuit transitions from low level to high level.

Duration $T_A$ of the second time period between $t_2$ and $t_3$ is a time required for a voltage value of the first capacitor to increase from $V_{T1}$ to $V_2$; therefore, $T_A$ may be determined according to a formula (5):

$$T_A=(V_2-V_{T1})*C_1/I_1 \quad \text{Formula (5)},$$

where $C_1$ is a capacitance value of the first capacitor 3113.

Optionally, in the embodiment of the present application, the first transistor 3111 and the second transistor 3121 may adopt the same transistor parameters, for example, parameters (such as μ, $C_{ox}$, W, L and the like) of the first transistor 3111 may be the same as the corresponding parameter of the second transistor 3121, and $V_{TH}$ of the first transistor may be considered to be equal to $V_{TH}$ of the second transistor.

$V_{T1}=V_{GS1}=V_{OV1}+V_{TH}$, $V_2=V_{GS2}=V_{OV2}+V_{TH}$, where $V_{GS1}$ is the voltage difference between the voltage of the gate and the voltage of the source of the first transistor 3111, $V_{OV1}$ is an overdriving voltage of the first transistor 3111, $V_{GS2}$ is a voltage difference between a voltage of a gate and a voltage of a source of the second transistor 3121, and $V_{OV2}$ is an overdriving voltage of the second transistor 3121.

It can be seen from the formula (3) that $V_{OV2}=\sqrt{I_2/I_1}*V_{OV1}$, a voltage difference between $V_{T1}$ and $V_2$ is:

$$V_2-V_{T1}=V_{OV2}+V_{TH}-V_{OV1}-V_{TH}=V_{OV2}-V_{OV1}=(\sqrt{I_2/I_1}-1)*V_{OV1} \quad \text{Formula (6).}$$

It may be obtained by substituting the formula (6) into the formula (5) that:

$$T_A=(V_2-V_{T1})*C_1/I_1=(\sqrt{I_2/I_1}-1)*V_{OV1}*C_1/I_1 \quad \text{Formula (7)}$$

Optionally, the first transistor may also adopt the same transistor parameters as that of a transistor in a DA, and the current value of the first current source and a drain current of the transistor in the DA may also be multiples of one another, for example, a current may be provided for the first transistor and the transistor in the DA by a mirror current source, and in this way, a current flowing into the transistor in the DA and a current flowing into the first transistor are multiples of one another, that is, $I=KI_1$. It can be seen from the formula (4) that a transconduction of the transistor in the DA and a transconduction of the first transistor are also multiples of one another, that is, $g_m=\sqrt{K}g_{m_1}$, where $g_m$ is the transconduction of the transistor in the DA, and $g_{m1}$ is the transconduction of the first transistor.

Since $g_{m1}=2I_1/V_{OV1}$, the transconduction $g_m$ of the transistor in the DA may be determined by a formula (8):

$$g_m=\sqrt{K}g_{m_1}=2*I_1/V_{OV1} \quad \text{Formula (8).}$$

An amplification coefficient $A_v$ of a dynamic amplification circuit may be obtained by substituting the formula (8) and the formula (7) into the formula (1), as shown in a formula (9):

$$A_v=-g_m*T_A/C_L=-2(\sqrt{I_2/I_1}-1)*\sqrt{K}*C_1/C_L \quad \text{Formula (9).}$$

When transistor parameters of two transistors are the same and currents flowing into the two transistors are equal, it can be seen from the formula (4) that transconductions of the two transistors are also equal, that is, $\sqrt{K}=1$, and the amplification coefficient $A_v$ of the dynamic amplification circuit as shown in the formula (9) may be simplified as a formula (10):

$$A_v=-g_m*T_A/C_L=2(\sqrt{I_2/I_1}-1)*C_1/C_L \quad \text{Formula (10).}$$

For example, if $I_2=4I_1$, $A_v=2C_1/C_L$, and if $I_2=9I_1$, $A_v=3C_1/C_L$, that is, Av is related only to a capacitance value, namely, only if the overdriving voltage $V_{OV1}$ of the first transistor and the overdriving voltage $V_{OV2}$ of the second transistor are multiples of one another, relatively stable gain may be obtained.

Optionally, in the embodiment of the present application, the first transistor and the second transistor may be metal oxide semiconductor (MOS) transistors, such as N-channel depletion type MOS transistors, N-channel enhancement type MOS transistors, P-channel depletion type MOS transistors, P-channel enhancement type MOS transistors or the like. A type of a transistor in the drawing of the embodiment of the present application is merely exemplary, rather than setting any limitation to the embodiment of the present application, and an equivalent circuit obtained by those skilled in the art according to the example in the drawing falls in the protection scope of the embodiment of the present application.

Figure 7:
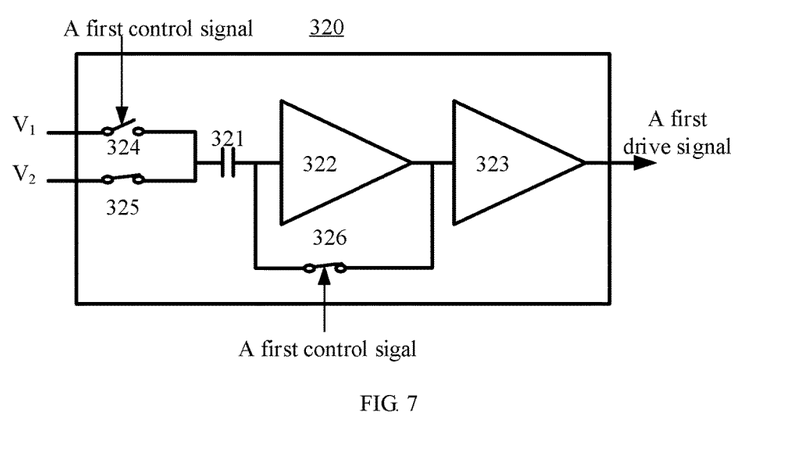
FIG. 7 is a schematic structural diagram of an example of a second drive circuit according to an embodiment of the present disclosure.

FIG. 7 is a schematic structural diagram of an example of a second drive circuit according to an embodiment of the present application. FIG. 7 shows a possible implementation manner or a preferred implementation manner of the second drive circuit; however, the embodiment of the present application is not limited to this implementation manner, and various equivalent amendment or variations according to this implementation manner fall in the scope of the embodiment of the present application.

As shown in FIG. 7, a second drive circuit 700 includes a second capacitor 321, a first inverter 322 and a second inverter 323.

One end of the second capacitor 321 receives a first voltage signal via a second switch device 324 and receives a second voltage signal via a third switch device 325, and the other end of the second capacitor 321 is connected to an input end of the first inverter 322; and the input end and an output end of the first inverter 322 are connected via a fourth switch device 326, the output end of the first inverter 322 is connected to an input end of the second inverter 323, and an output end of the second inverter 323 is used to output a first drive signal.

A first control signal is used to:

control, in a first time period, a second switch device to be turned off and a third switch device and a fourth switch device to be turned on, and control, in a second time period and a third time period, the second switch device to be turned on and the third switch device and the fourth switch device to be turned off Generally, operating states of switch devices controlled by the first control signal are provided as follows:

at $t_1$, turning on a first switch device, the third switch device and the fourth switch device, and turning off the second switch device;

at $t_2$, turning off the first switch device, the third switch device and the fourth switch device, and turning on the second switch device; and at $t_3$, turning on the first switch device, the third switch device and the fourth switch device, and turning off the second switch device.

In this way, in a first time period between $t_1$ and $t_2$, the second switch device 324 is turned off, the third switch device 325 is turned on, the fourth switch device 326 is turned on, a voltage of one end of the second capacitor 321 is V2, a voltage of the other end of the second capacitor 321 is a threshold voltage $V_{THINV}$ of the first inverter 322, and a voltage drop on the second capacitor 321 is $V_{THINV}-V_2$.

As described above, in the first time period, whether the first drive signal outputs low level or high level is not concerned, as long as in the first time period, the first control signal is at high level, and a second control signal output by a third drive circuit is at low level.

In a second time period between $t_2$ and $t_3$, the second switch device 324 is turned on, the third switch device 325 is turned off, the fourth switch device 326 is turned off, and a voltage of one end of the second capacitor 321 is $V_1$. Based on a principle of charge conservation, a voltage drop on the second capacitor 321 does not change, and a voltage of the input end of the first inverter is $V_1+V_{THINV}-V_2$. Since $V_1<V_2$ in the second time period, $V_1+V_{THINV}-V_2<V_{THINV}$. The first drive signal outputs high level after passing through the first inverter, and then it outputs low level after passing through the second inverter.

In a third time period after $t_3$, $V_1 \geq V_2$, and $V_1+V_{THINV}-V_2 \geq V_{THINV}$. The first drive signal outputs low level after passing through the first inverter, and then it outputs high level after being inverted by the second inverter.

Optionally, the embodiment of the present application may further adopt another equivalent circuit to implement a function of the second drive circuit, that is, low level is output when the first voltage signal is less than the second voltage signal, and high level is output when the first voltage signal is greater than or equal to the second voltage signal.

Optionally, in the embodiment of the present application, since the first control signal may be used to control turnon and turnoff of the first switch device, a first bias circuit may further include a first control signal input end, where the input end is used to input the first control signal, thereby controlling the turnon and turnoff of the first switch device through the first control signal.

Similarly, the second drive circuit may also include a first control signal input end, where the input end is used to input the first control signal, thereby controlling turnon and turnoff of the second switch device, the third switch device and the fourth switch device through the first control signal.

It should be understood that, in the embodiment of the present application, the first control signal is used to control turnon and turnoff of the first switch device, the second switch device, the third switch device, the fourth switch device and a first control switch, and a second control signal is used to control turnon and turnoff of a second control switch. These only represent that control signals have a function of controlling respective corresponding switch devices, instead of representing that there must be a direct connection relationship between input ends of these control signals and respective corresponding switch devices. It has only to be ensured that input control signals may control turnon and turnoff of corresponding switch devices.

Figure 8:
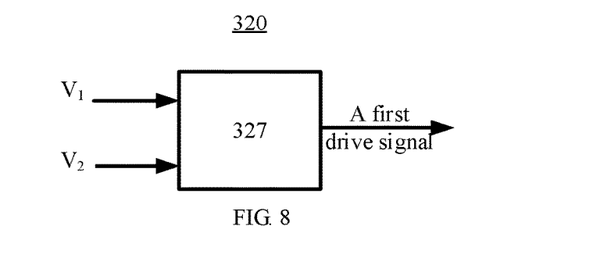
FIG. 8 is a schematic structural diagram of another example of a second drive circuit according to an embodiment of the present disclosure.

FIG. 8 is a schematic structural diagram of another example of a second drive circuit according to an embodiment of the present application. As shown in FIG. 8, a second drive circuit 320 is a continuous time comparator 327, a first input end of the continuous time comparator 327 is used to receive a first voltage signal $V_1$, a second input end of the continuous time comparator is used to receive a second voltage signal $V_2$, and an output end of the continuous time comparator 327 is used to output a first drive signal.

Particularly, in a first time period and a second time period, $V_1<V_2$, and the continuous time comparator 327 outputs low level; and in a third time period, $V_1 \geq V_2$, and an output voltage of the continuous time comparator 327 transitions from low level to high level.

Therefore, both a continuous time comparator shown in FIG. 8 and a combination circuit shown in FIG. 7 may implement a function of a second drive circuit, that is, low level is output when a first voltage signal is less than a second voltage signal, and high level is output when the first voltage signal is greater than or equal to the second voltage signal. In comparison with the continuous time comparator shown in FIG. 8, the combination circuit shown in FIG. 7 does not have to perform continuous comparisons, and thus power consumption is relatively low.

Figure 9:
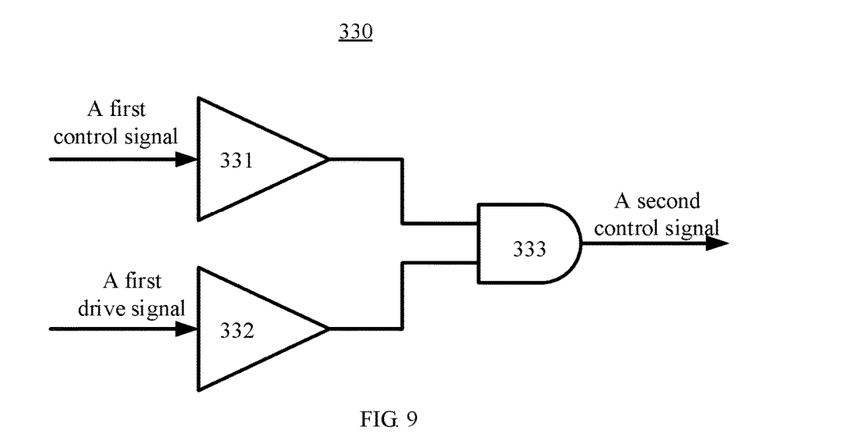
FIG. 9 is a schematic structural diagram of an example of a third drive circuit according to an embodiment of the present disclosure.

FIG. 9 is a schematic structural diagram of an example of a third drive circuit according to an embodiment of the present disclosure. As shown in FIG. 9, a third drive circuit 330 includes a third inverter 331, a fourth inverter 332 and an AND circuit 333.

An input end of the third inverter 331 is used to receive a first control signal, and an output end of the third inverter 331 is connected to a first input end of the AND circuit 333;

an input end of the fourth inverter 332 is used to receive a first drive signal, and an output end of the fourth inverter 332 is connected to a second input end of the AND circuit 333; and an output end of the AND circuit 333 is used to output a second control signal.

Namely, the second control signal outputs high level only when the first control signal and the first drive signal are at low level, and the second control signal outputs low level when the first control signal and the first drive signal are in other operating states.

Optionally, the AND circuit 333 may be implemented with an AND gate or another equivalent circuit.

Therefore, a dynamic amplification circuit of an embodiment of the present application controls voltage values output by a first voltage signal and a second voltage signal through a first control signal, and then controls duration of a second time period to be inversely proportional to a transconductance of a transistor in a DA in a saturation region according to the first voltage signal and the second voltage signal, so that the dynamic amplification circuit is still capable of providing relatively stable gain when PVT change.

It should be understood that, first, second, third, fourth and various numerical numbers (for example, a first drive circuit 310, a second drive circuit 310 and the like) involved in the text are merely for convenience of description, and are not intended to limit the protection scope of embodiments of the present application.

A cathode of a power supply in the foregoing embodiments may be set as a ground potential (i.e., grounding), or may be another potential in a specific implementation of course, such as a negative potential, which is not limited by the embodiments of the present application.

It should be understood that the term "and/or" herein merely describes association relations between associated objects, and expresses three relations, for example, A and/or B may express three conditions, namely A exists separately, A and B exist simultaneously and B exists separately. In addition, the character "/" herein generally represents an "or" relationship of two related objects before and after the character.

It should be understood that, in various embodiments of the present application, values of sequence numbers of the foregoing various processes do not mean an order of execution which should be determined based upon functionalities and internal logics thereof, rather than setting any limitation to implementation of the embodiments of the present application.

Those of ordinary skill in the art may be aware that, units and algorithm steps of the examples described in the embodiments disclosed in this paper may be implemented by electronic hardware, computer software, or a combination of the two. Whether these functions are executed in hardware or software mode depends on the specific applications and design constraint conditions of the technical solution. Those skilled may implement the described functions by using different methods for each specific application, but this implementation should not be considered to be beyond the scope of the present application.

Those skilled in the art to which the present application pertains may clearly understand that, for convenience and simplicity of description, for the specific working processes of the system, the apparatus and the units described above, may refer to corresponding processes in the foregoing method embodiments, and will not be repeated redundantly herein.

In the several embodiments provided in the present application, it should be understood that, the disclosed system, apparatus and method may be implemented in other manners. For example, the apparatus embodiments described above are merely exemplary, e.g., the division of the units is merely a logic function division, other division manners may exist in practical implementation, for example, a plurality of units or components may be combined or integrated to another system, or some features may be omitted or not implemented. From another point of view, the displayed or discussed mutual coupling or direct coupling or communication connection may be indirect coupling or communication connection via some interfaces, apparatuses or units, and may be in electrical, mechanical or other forms.

The units described as separate parts may be or may not be separated physically, and a component displayed as a unit may be or may not be a physical unit, namely, may be located in one place, or may be distributed on a plurality of network units. A part of or all of the units may be selected to achieve the purposes of the solution in the present embodiments according to actual demands.

In addition, the respective functional units in the embodiments of the present application may be integrated in a processing unit, or the respective units exist separately and physically, or two or more units are integrated in one unit.

If the functions is implemented in the form of the software functional unit and is sold or used as an independent product, it may be stored in a computer readable storage medium. Based on such understanding, the technical solution of the present application substantially, or the part of the present application making contribution to the prior art, or a part of the technical solution may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The foregoing storage medium includes a variety of media capable of storing program codes, such as a USB disk, a mobile hard disk, a read-only memory (ROM, Read-Only Memory), a random access memory (RAM, Random Access Memory), a magnetic disk, an optical disk or the like.

Described above are specific embodiments of the present application only, but the protection scope of the present application is not limited thereto, those skilled who are familiar with the art could readily think of variations or substitutions within the technical scope disclosed by the present application, and these variations or substitutions shall fall within the protection scope of the present application. Therefore, the protection scope of the present application should be determined with reference to the protection scope of the claims.

What is claimed is:

1. A dynamic amplification circuit, comprising:
a first drive circuit, configured to receive a first control signal, and generate a first voltage signal and a second voltage signal, the first voltage signal varying with time, and the second voltage signal being a constant voltage;
a second drive circuit, configured to receive the first voltage signal and the second voltage signal, and generate a first drive signal;
a third drive circuit, configured to receive the first control signal and the first drive signal, and generate a second control signal; and
a dynamic amplifier (DA), comprising a first control switch, a second control switch and a transistor,
wherein the DA is configured to receive the first control signal and the second control signal, and control on and off of the first control switch and the second control switch through the first control signal and the second control signal, respectively;
in a first time period, the first control signal is at a high level, a voltage value of the first voltage signal is a first voltage value, a voltage value of the second voltage signal is a second voltage value, and the second control signal is at a low level;
in a second time period after the first time period, the first control signal is at a low level, the voltage value of the first voltage signal increases and is less than the second voltage value, the first drive signal is at a low level, and the second control signal is at a high level;
in a third time period after the second time period, the first control signal is at a low level, the voltage value of the first voltage signal is greater than or equal to the second voltage value, the first drive signal is at a high level, and the second control signal is at a low level; and
duration of the second time period is inversely proportional to a transconductance of the transistor in the DA in a saturation region.

2. The dynamic amplification circuit according to claim 1, wherein the first drive circuit comprises:
a first bias circuit, configured to receive the first control signal, and generate the first voltage signal,
wherein the first bias circuit comprises a first transistor, a first current source and a first capacitor, a drain of the first transistor is connected to the first current source, one end of the first capacitor is connected to the drain of the first transistor and is connected to a gate of the first transistor via a first switch device, a source of the first transistor is connected to the other end of the first capacitor, and the drain of the first transistor is used to output the first voltage signal; and
a second bias circuit, configured to output the second voltage signal,
wherein the second bias circuit comprises a second transistor and a second current source, a drain of the second transistor is connected to the second current source, the drain of the second transistor is connected to a gate of the second transistor, and the drain of the second transistor is used to output the second voltage signal,
wherein a transistor parameter of the first transistor is the same as a corresponding transistor parameter of the second transistor, and a current value of the second current source is greater than a current value of the first current source.

3. The dynamic amplification circuit according to claim 2, wherein the current value of the second current source is a multiple of the current value of the first current source.

4. The dynamic amplification circuit according to claim 2, wherein a current provided for the first transistor and a current provided for the transistor of the DA are produced by a mirror current source.

5. The dynamic amplification circuit according to claim 2, wherein transistor parameters of the first transistor and the second transistor are the same as a corresponding transistor parameter of the transistor in the DA.

6. The dynamic amplification circuit according to claim 2, wherein the first control signal is further used to control turnon and turnoff of the first switch device,
wherein the first control signal is used to:
control, in the first time period, the first switch device to be turned on, and control, in the second time period and the third time period, the first switch device to be turned off.

7. The dynamic amplification circuit according to claim 2, wherein the first transistor and the second transistor are metal oxide semiconductor (MOS) transistors.

8. The dynamic amplification circuit according to claim 2, wherein a voltage value obtained by subtracting a threshold voltage of the second transistor from the second voltage value is a multiple of a voltage value obtained by subtracting a threshold voltage of the first transistor from the first voltage value.

9. The dynamic amplification circuit according to claim 1, wherein the second drive circuit comprises a second capacitor, a first inverter and a second inverter,
wherein one end of the second capacitor receives the first voltage signal via a second switch device and receives the second voltage signal via a third switch device, and the other end of the second capacitor is connected to an input end of the first inverter; and
the input end and an output end of the first inverter are connected via a fourth switch device, the output end of the first inverter is connected to an input end of the second inverter, and an output end of the second inverter is used to output the first drive signal.

10. The dynamic amplification circuit according to claim 9, wherein the first control signal is further used to:
control turnon and turnoff of the second switch device, the third switch device and the fourth switch device,
wherein the first control signal is used to:
control, in the first time period, the second switch device to be turned off and the third switch device and the fourth switch device to be turned on, and control, in the second time period and the third time period, the second switch device to be turned on and the third switch device and the fourth switch device to be turned off.

11. The dynamic amplification circuit according to claim 1, wherein the second drive circuit is a continuous time comparator, a first input end of the continuous time comparator is used to receive the first voltage signal, a second input end of the continuous time comparator is used to receive the second voltage signal, and an output end of the continuous time comparator is used to output the first drive signal.

12. The dynamic amplification circuit according to claim 1, wherein the third drive circuit comprises a third inverter, a fourth inverter and an AND circuit,
wherein an input end of the third inverter is used to receive the first control signal, and an output end of the third inverter is connected to a first input end of the AND circuit;
an input end of the fourth inverter is used to receive the first drive signal, and an output end of the fourth inverter is connected to a second input end of the AND circuit; and
an output end of the AND circuit is used to output the second control signal.

13. The dynamic amplification circuit according to claim 1, wherein the DA further comprises a third capacitor, one end of the third capacitor is connected to a cathode of a power supply, the other end of the third capacitor is connected to an anode of the power supply via the first control switch, the other end of the third capacitor is further connected to one end of the second control switch, and the other end of the second control switch is connected to a drain of the transistor;

the first control signal is used to:
   control, in the first time period, the first control switch to be turned on, and control, in the second time period and the third time period, the first control switch to be turned off; and the second control signal is used to:
   control, in the first time period, the second control switch to be turned off, control, in the second time period, the second control switch to be turned on, and control, in the third time period, the second control switch to be turned off.

* * * * *